(12) United States Patent
Narang

(10) Patent No.: US 6,855,378 B1
(45) Date of Patent: *Feb. 15, 2005

(54) PRINTING OF ELECTRONIC CIRCUITS AND COMPONENTS

(75) Inventor: Subhash Narang, Palo Alto, CA (US)

(73) Assignee: SRI International, Menlo Park, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/762,881
(22) PCT Filed: Nov. 24, 1998
(86) PCT No.: PCT/US98/25088
§ 371 (c)(1), (2), (4) Date: Mar. 27, 2001
(87) PCT Pub. No.: WO00/10736
PCT Pub. Date: Mar. 2, 2000

Related U.S. Application Data

(60) Provisional application No. 60/097,706, filed on Aug. 21, 1998.

(51) Int. Cl.$^7$ .............................. B05D 3/06; B05D 5/12; H01M 2/14; H01M 4/04; H01M 4/54; H01M 4/52; H01M 4/38
(52) U.S. Cl. .................... 427/553; 427/115; 427/123; 427/125; 427/126.3; 427/126.1; 429/219; 429/220; 429/221; 429/223; 429/188; 429/189
(58) Field of Search ................................ 427/553, 115, 427/123, 125, 126.3–126.6; 429/218, 218.1, 218.2, 219, 220, 223, 188, 189, 193, 109, 221

(56) References Cited

U.S. PATENT DOCUMENTS

| | | | |
|---|---|---|---|
| 3,653,967 A | * | 4/1972 | Beauchamp |
| 3,956,528 A | * | 5/1976 | Ugro, Jr. ............ 427/123 |
| 4,079,156 A | * | 3/1978 | Youtsey et al. ....... 427/97 |
| 4,517,227 A | * | 5/1985 | Cassat ................ 427/96 |

(List continued on next page.)

FOREIGN PATENT DOCUMENTS

| | | |
|---|---|---|
| EP | 0468249 | 7/1991 |
| EP | 0855726 | 1/1997 |

OTHER PUBLICATIONS

T.H. Baum et al *IBM Tech. Discl. Bull.* "Process for Photochemical Catalysis of Electroless Copper Plating Onto Polymeric Substrates"; vol. 33, No. 6B, pp. 297–298, Nov. 1990.*

(List continued on next page.)

*Primary Examiner*—Marianne Padgett
(74) *Attorney, Agent, or Firm*—Lumen Intellectual Property Services, Inc.

(57) ABSTRACT

Methods are disclosed for printing (2–7) multilayer electronic components, and circuits on a surface (2), where at least one of the layers is formed by a redox reaction (6) occurring in a deposited solution (4, 5). Electronic components may comprise semiconductors such as in transistors or diode, or metal oxide or electrolyte such as in batteries or fuel cells, or are capacitors, inductors, and resistors. Preferably, the oxidizer of the redox reaction is a strong oxidizer, and the reducer is a strong reducer (3). Reactions are preferably sufficiently exothermic that they can be initiated (6), rather than driven to completion, by microwave or other suitable energy sources, and may yield substantially pure metal or metal oxide layers. The solution being deposited (5) may have either high concentrations of particulates, such as 60–80 wt. % of dry weight, or low concentrations of particulates, such as ≦5 wt. % or ≦2 wt. %. Low particulate content provides printing of structures having lateral resolution of ≦10 μm, ≦5 μm, or ≦1 μm.

18 Claims, 5 Drawing Sheets

U.S. PATENT DOCUMENTS

| | | | | |
|---|---|---|---|---|
| 4,576,689 A | * | 3/1986 | Makkaev et al. | 427/97 |
| 4,670,122 A | * | 6/1987 | Mathur et al. | 427/126.6 |
| 4,775,556 A | * | 10/1988 | Krause et al. | 427/123 |
| 4,863,484 A | * | 9/1989 | Beauchamp et al. | 429/223 |
| 5,116,582 A | * | 5/1992 | Cooper et al. | 422/186.3 |
| 5,344,728 A | * | 9/1994 | Ovshinsky et al. | 429/223 |
| 5,756,146 A | * | 5/1998 | Lee et al. | 427/123 |
| 5,830,597 A | | 11/1998 | Hoffmann et al. | 429/111 |
| 5,846,615 A | * | 12/1998 | Sharma et al. | 427/597 |
| 5,948,464 A | | 9/1999 | Delnick | 427/777 |
| 5,980,813 A | * | 11/1999 | Narang et al. | 264/401 |
| 5,980,998 A | * | 11/1999 | Sharma et al. | 427/559 |
| 6,146,716 A | * | 11/2000 | Narang | 427/559 |
| 6,280,879 B1 | | 8/2001 | Andersen et al. | 429/233 |
| 6,294,111 B1 | | 9/2001 | Shacklett, III et al. | 252/518.1 |
| 6,548,122 B1 | * | 4/2003 | Sharma et al. | 427/559 |

OTHER PUBLICATIONS

Baum et al, "Photoselective Circuitization of Dielectrics Via Electroless Plating of Metals", *Metallized Plastics 3: Fundamentals and Applied Aspects*, K.L. Mittal, ed. Plenum Press, New York, p. 9–17, 1992 no month.*

Baum et al "Photoselective Catalysis of Electroless Copper Solutions for the Formation of Adherent Copper Films into Polyimide", *Chem. Mater.*, vol. 3, No. 4, p 714–720, 1991 no month.*

* cited by examiner

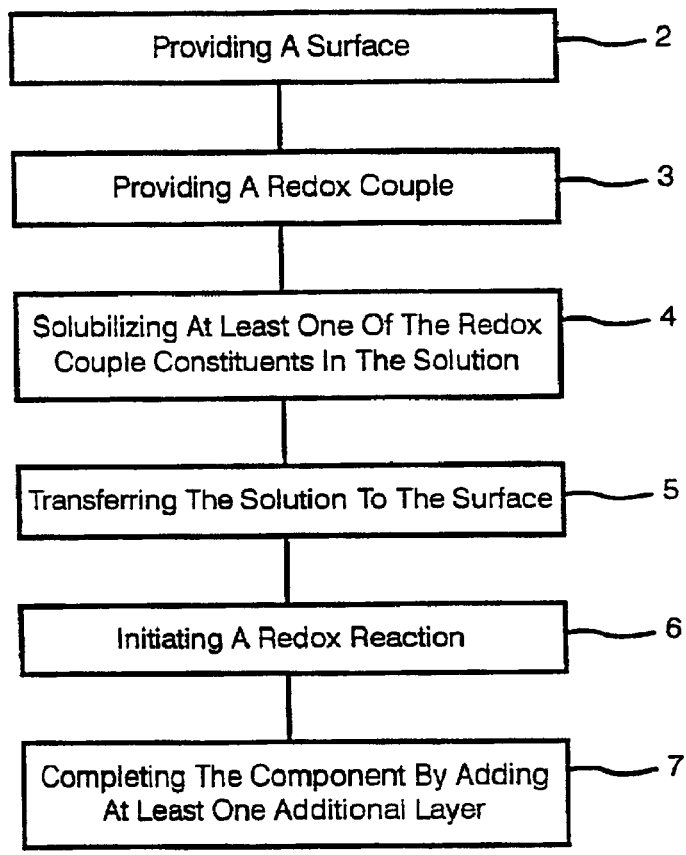
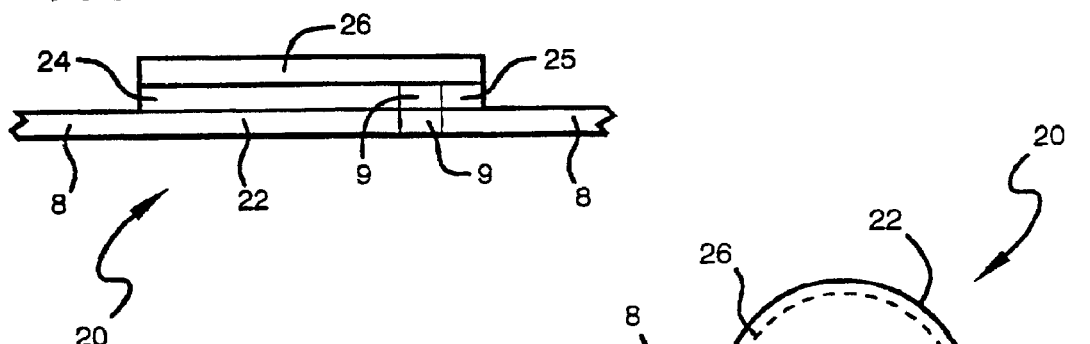
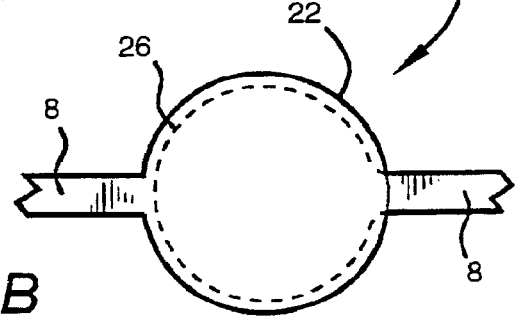

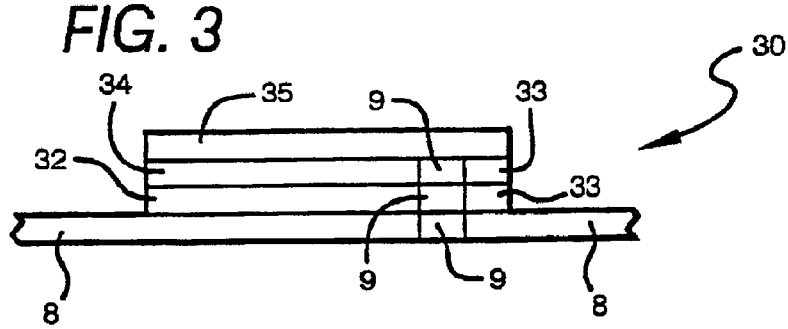
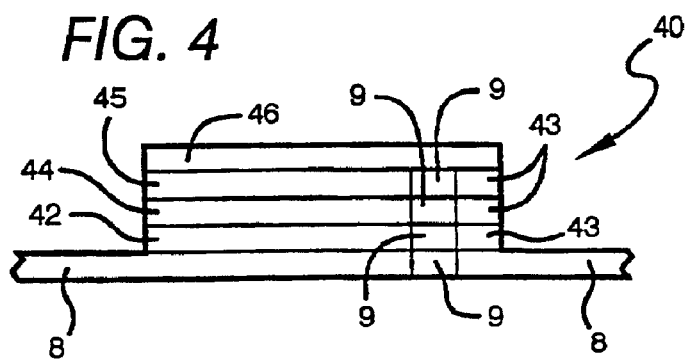
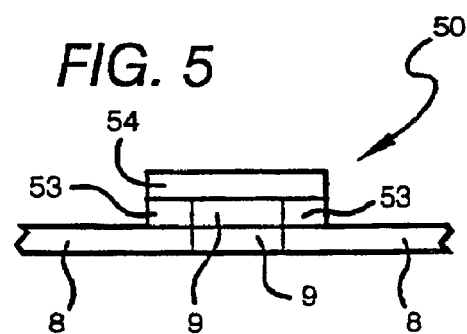
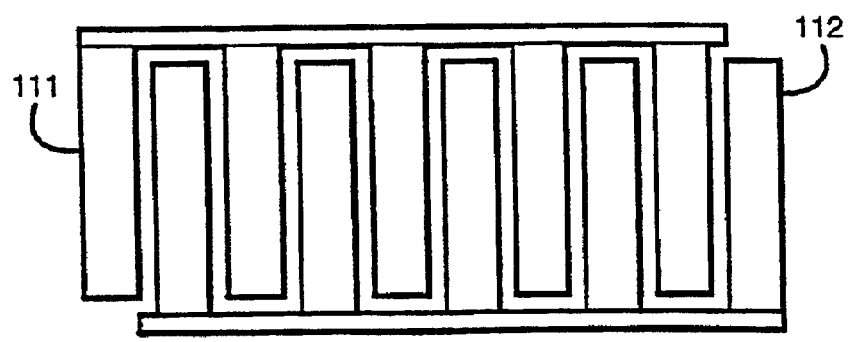

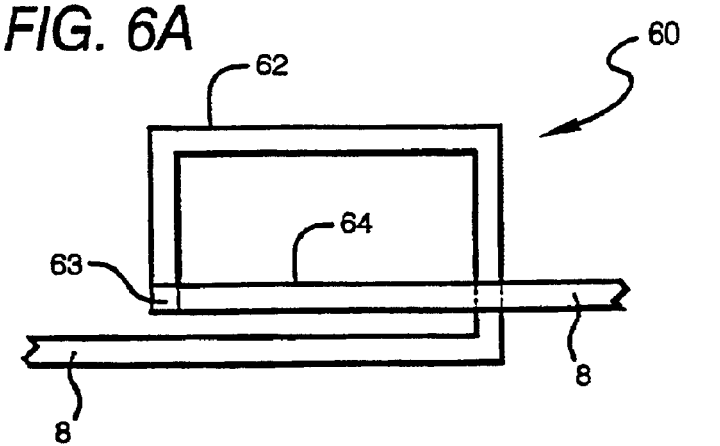
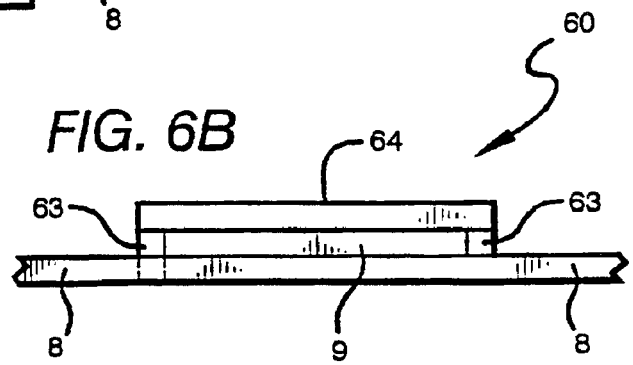
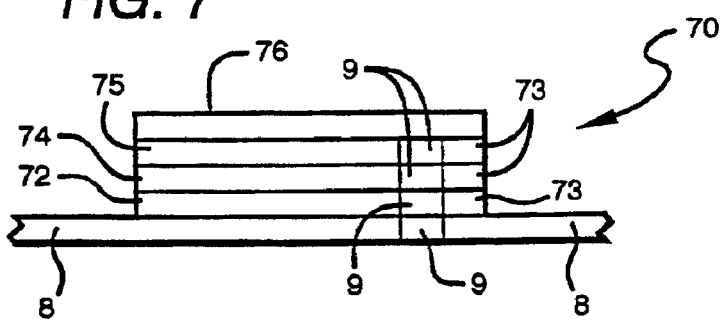
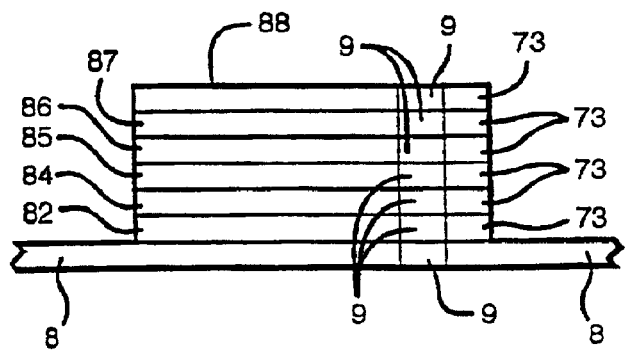

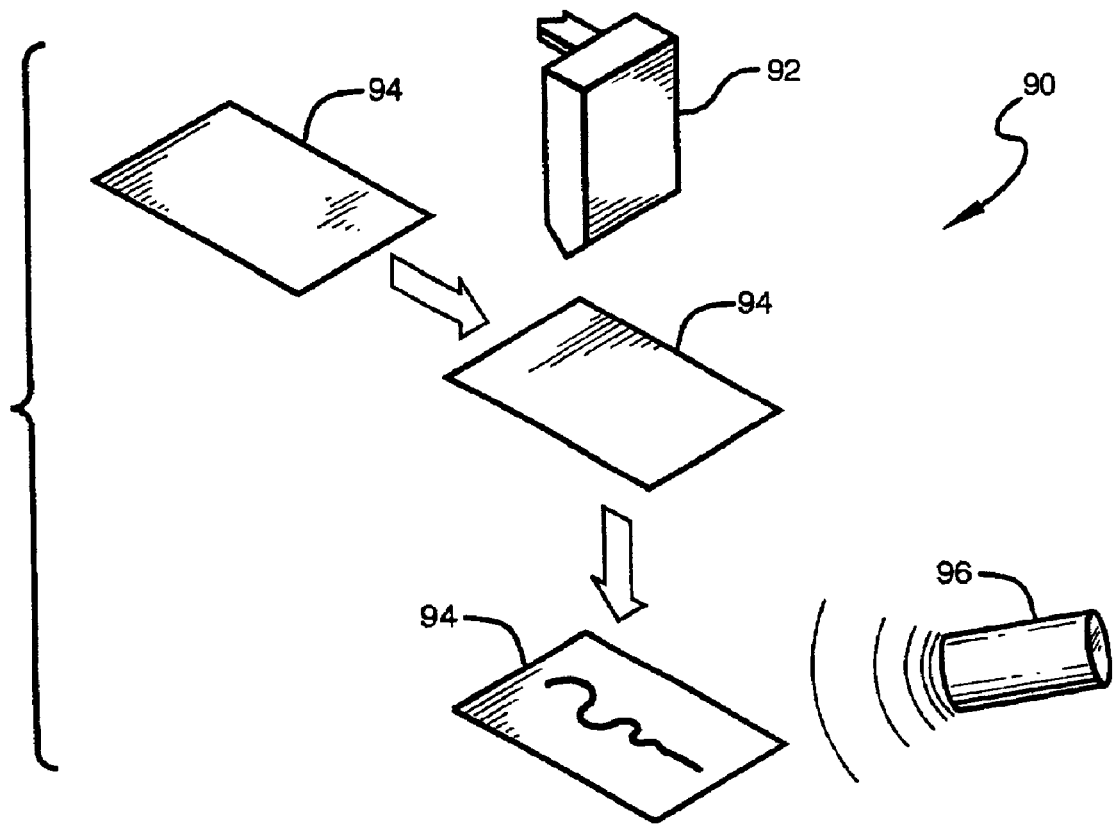
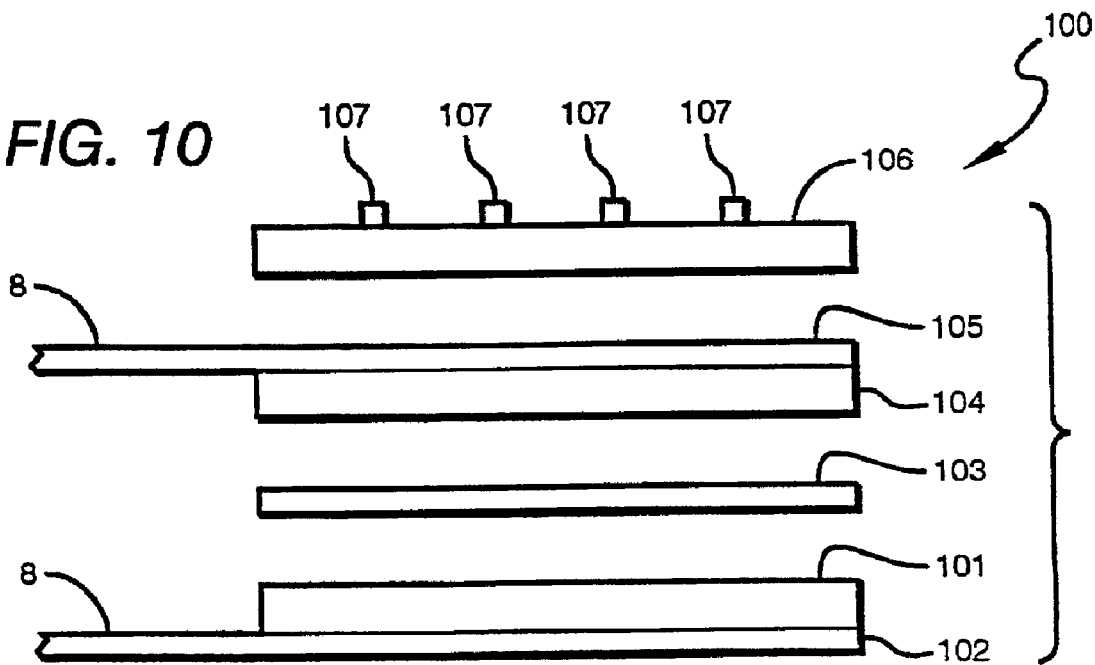

PRINTING OF ELECTRONIC CIRCUITS AND COMPONENTS

This application claims the benefit of Provisional Application No. 60/097,706 filed Aug. 21, 1998.

REFERENCE TO GOVERNMENT GRANT

This invention was made with Government support. The Government may have certain rights in the invention.

FIELD OF THE INVENTION

The field of the invention is printing of electronic circuits and components.

BACKGROUND OF THE INVENTION

Electronic circuits and components are ubiquitous in almost every field of the modern world, from communications to computing, transportation, energy production, storage and control, consumer goods, radios, navigation, and so forth. In each of these fields there continues to be a demand to produce ever smaller and less expensive products, and this demand in turn manifests as a push for ever more integrated circuits and components.

The earliest electronic products were, of course, wired by hand. While some products are still produced at least in part by hand, hand produced circuit boards have largely been supplanted by machine printed circuit boards, and discrete components have largely been supplanted by highly integrated components such as LSICs and VLICs.

Despite these advancements, most electronic devices are still generally manufactured by printing a circuit board, populating the circuit board with components, and then wave soldering or otherwise coupling the connector pins of the components to the board. There are a few devices in which portions of both circuit and components are more or less "printed" using ordinary printing techniques such as silk screening, and perhaps the most widely known examples are battery testers employed on AA and other small consumer batteries. An exemplary description is found in U.S. Pat. No. 4,702,563 to Parker (October 1987). However, such devices are severely limited as to the type and complexity of the circuit and components, and there remains a considerable need for more versatile apparatus and techniques for printing circuits and components.

This situation results at least in part from production of circuit boards by processes that are incapable of providing the multiple layers needed for many electronic components. For example, in a typical photolithography production of a circuit board, a metal film such as copper is applied to a rigid, non-conductive substrate, such as fiberglass. A sheet of the conductive metal is then laminated to the substrate, and a photoresist coated onto the laminate. The board is exposed to a light pattern using a light mask to reproduce the metal pattern desired, and exposure is followed by photoresist development. Finally, the entire board is immersed into a bath so that the applied metal left unprotected by the photoresist can be etched away. In another photolithographic process, it is known to form electrically conductive metal pathways by coating a substrate with a composition containing a reducible metal complex. In one such process, a substrate is coated with a sorbitol copper formate solution containing a photoactivated reducing agent. Upon exposure to ultraviolet radiation, unmasked areas are reduced to copper metal, and the remainder of the board is washed clean.

While such techniques are capable of producing single layers of high quality and definition, they are not well suited for depositing multiple layers, especially multiple layers of different materials. Especially inconsistent with standard circuit board printing techniques are printing of multilayer components such as batteries, which require specialized materials for the anode, cathode and electrolyte layers.

Silk Screening

Other techniques commonly used to print circuit boards, such as silk screening, are capable of printing multiple layers, but they do not lend themselves to printing anything but the simplest electronic components. For example, in U.S. Pat. No. 5,148,355 to Lowe (September 1992), the disclosure of which is incorporated herein by reference, circuits and electronic components such as conductors, resistors, capacitors, and insulators are produced by successive screen printing of polymer based conductive and resistive inks. It is claimed that Lowe's process may be employed to deposit as many as 30 to 50 layers on top of one another, with thickness control variance of 5 microns, and minimum spacing between adjacent conductors on the order of about 0.01 inch.

While advantageous in many ways, processes according to Lowe suffer from the use of inks in which metals are suspended as discreet particles, preferably silver flakes. Even though such particles may measure only 3–50 microns in diameter, such inks dry to form traces and layers in which current is carried by particle—particle contact rather than by a continuous mass. In addition to forming relatively poor conductors, the particle size effectively limits the smallest trace to several times the diameter of the largest particles. Still further, the potential for discontinuities in narrow traces and thin deposits appears to pose a problem of sufficient significance that repeated depositions, at slight offsets or angles are necessary to achieve reliable traces.

Another disadvantage is that Lowe is limited to printing electronic components that include only conductive, resistive and insulative portions. Lowe offers no guidance, for cop example, in printing batteries where the electrodes may advantageously comprise metal oxides, and the electrolyte may comprise a liquid or polymer. Lowe also offers no guidance in the printing of semiconductors.

Electroless Deposition

Even if known silk screening techniques were capable of printing the fineness required for electronic components, they would still be too slow for mass production of circuit/circuit component combinations. For such purposes higher speed printing techniques such as offset and intaglio printing are desired. U.S. Pat. No. 5,127,330 to Okazaki et al. (July 1992) discloses specialized inks that can be employed to produce very fine traces (3 $\mu$m wide and 2 $\mu$m thick) in intaglio printing, but there is no teaching or suggestion of employing the specialized inks for producing the multiple layers. Some work has been done on high-speed electroless deposition printing of electronic components, and representative disclosures of such processes are discussed below.

In U.S. Pat. No. 5,403,649 to Morgan et al. (April 1995), the disclosure of which is incorporated herein by reference, two-dimensional imaged metal articles are fabricated on webs by electroless deposition of catalytic inks using rotogravure. It is claimed that by layering thin lines of differing materials, numerous electronic components can be printed, including diodes, resistors, capacitors, batteries, sensors and fuel cells. The invention seems to arise from an especially low viscosity (about 20–600 centipoises) class of catalytic inks having less than about 10% solids, and which are said to permit printing of lines down to lateral (width) resolutions of 25 microns. Morgan also refers to the use of inks containing reducible metal ions in conjunction with a reducing agent such as acetate and ammonium.

The teachings of Morgan suffer from several drawbacks. First, the inks contemplated by Morgan all contain a polymer that remains as an impurity in the deposited material. Such impurities adversely affect conductivity and other function. A previous patent, U.S. Pat. No. 4,921,623 to Yamaguchi et al. (May 1990) highlights this distinction, by referring to the deposit formed from a solution containing a copper powder, a binder, and other ingredients as a "copper-type" coating, rather than a "copper" coating.

Another drawback is that even though Morgan reduces the particulate-containing portion of the ink to less than 10 wt %, Morgan still requires a substantial particulate content. As described above with respect to the Lowe patent, particulate content adversely affects function. Morgan does suggest possible substitution of metal particulate with metal salts in the inks, but even there Morgan teaches that the metal ions in the salts would be reduced the metal form prior to deposition.

Another drawback is that Morgan's conception appears to be limited to plate-based printing techniques that can print at high speeds of several hundred meters per minute. Plates for such presses can be difficult and expensive to manufacture, and even minor variations in a design may require costly redesign.

U.S. Pat. No. 5,758,575 to Isen (June 1998), the disclosure of which is incorporated herein by reference, teaches the continuous printing of inks using a rotogravure process implemented in multiple stations. Thick films are contemplated, and by drying each layer of ink before laying down a subsequent layer, multiple inks can be employed. Isen specifically refers to numerous specialty inks, including thermochromic inks, electrophosphorescent liquids, magnetochromic liquids, electrochromic liquids, and electroluminescent liquids, and teaches the use of spike rollers to make electrical contact between separated layers. Isen claims that his process can be used to produce electrical electronic components, including switches, diodes, capacitors, transistors, resistors, inductors, coils, batteries, and sensors.

Processes according to Isen suffer from several drawbacks. As with Lowe and Morgan, Isen still teaches deposition of a carrier (liquid, ink, etc) containing discrete particles. The existence of such particles adversely affects conductivity and other function.

In addition, the carrier for Isen's particulates is itself problematic. Suitable carriers are taught to include a quick drying solvent, which creates manufacturing and environmental difficulties. In addition, Isen teaches that suitable carriers include oligomeric materials, which may leave undesirable residues (see general discussion of particular containing inks in U.S. Pat. No. 4,666,735 to Hoover et al, May 1987).

Isen's process is particularly poor in handling instances where a deposited material is intended to function as a liquid. For example, in his description of electrolytes for use in forming batteries, Isen teaches deposition of microencapsulated electrolytes, presumably because simple deposition of a liquid electrolyte would lead to evaporation of the electrolyte itself. Isen does not contemplate printing a layer on top of a previously deposited liquid if layer.

Isen also appears to be limited to plate-based printing techniques such as rotogravure, flexographic, offset gravure, and letter press, and such plates can be costly to manufacture and modify. Isen suggests, for example, that such plates can be manufactured using such expensive and difficult techniques as diamond-stylus engraving, chemical etching, and laser inscribing.

Still another set of difficulties with the Isen process is that vias (throughs or interconnects) between layers are contemplated to be produced by spikes penetrating two or more layers. Spiking may be an inaccurate method of producing inter-layer connections, and may be especially problematic in interconnecting layers separated by more than one or two intervening layers.

Lamination

It is also known to provide electronic components in which a portion of the component is printed using conventional high speed printing equipment, and the remainder of the device is produced using some other technique such as lamination. A good example is U.S. Pat. No. 5,603,157 to Lake et al. (February 1997). In Lake, an insulative retaining ring for a button battery is printed on a substrate, cured, and then filled with a liquid electrolyte. Cathode and anode foils are laminated onto opposite sides of the ring, and the laminated product is then cut away to form the battery. In this manner, the battery is partially but not fully printed, and in any event the process is incapable of printing both circuit traces and electronic components. Other combination printing/laminate methods of producing batteries are described in U.S. Pat. No. 5,350,645 to Lake (September 1994) and U.S. Pat. No. 5,055,968 to Nishi (October 1991), and U.S. Pat. No. 4,621,035 to Bruder (November 1986).

Thus, there remains a need to provide new techniques for printing of both circuits and multilayered electronic components, especially for use with ink-jet and high-speed printing apparatus.

SUMMARY OF THE INVENTION

The present invention is directed to methods and apparatus for printing circuits, multilayer electronic components, and optionally circuits containing such components, in which at least one of the layers is formed from a material produced by a redox reaction occurring in a deposited solution.

Contemplated electronic components may advantageously comprise a semiconductor such as may be found in a transistor or diode, or a metal oxide or electrolyte such as may be found in a battery or fuel cell. Other contemplated components are capacitors, inductors, and resistors. In preferred embodiments, the oxidizer of the redox reaction is a strong oxidizer, and the reducer of the redox reaction is a strong reducer. In especially preferred embodiments, such reactions are sufficiently exothermic that they can be initiated, rather than driven to completion, by a microwave or other external energy source. Where the solution contains appropriate metal salts, such processes may advantageously yield substantially pure metal or substantially pure metal oxide layers.

In another aspect, the solution being deposited preferably has a very low concentration of particulates, such as $\leq 5$ wt % or $\leq 2$ wt %. Especially preferred solutions have essentially no particulates, and are therefore substantially homogeneous at the molecular level. Such low reduction in particulate content provides printing of very fine structures, such as those having lateral resolution of $\leq 10$ μm, $\leq 5$ μm, or even $\leq 1$ μm.

Various objects, feature, aspects and advantages of the present invention will become more apparent from the following detailed description of preferred embodiments of the invention, along with the accompanying drawings in which like numerals represent like components.

BRIEF DESCRIPTION OF THE DRAWINGS

FIG. 1 is a schematic of a method of forming circuits and multilayer electronic components.

FIG. 2A is a cross-sectional view of a capacitor produced according to the inventive subject matter.

FIG. 2B is a plan view of the capacitor of FIG. 2A.

FIG. 3 is a cross-sectional view of a diode produced according to the inventive subject matter.

FIG. 4 is a cross-sectional view of a transistor produced according to the inventive subject matter.

FIG. 5 is a cross-sectional view of a resistor produced according to the inventive subject matter.

FIG. 6A is a cross-sectional view of an inductor produced according to the inventive subject matter.

FIG. 6B is a plan view of the inductor of FIG. 6A.

FIG. 7 is a cross-sectional view of a battery produced according to the inventive subject matter.

FIG. 8 is a cross-sectional view of an integrated electronic component circuit comprising a battery and a capacitor produced according to the inventive subject matter.

FIG. 9 is a schematic of an ink-jet printing process for depositing metals, ceramics, and polymers using CAD/CAM data to control the printing process.

FIG. 10 is a schematic of an exploded unit cell structure for a battery laminate with an integral functional device.

FIG. 11 is a schematic of an interdigitated electrode structure for improved power capability.

DETAILED DESCRIPTION

Figure 12:
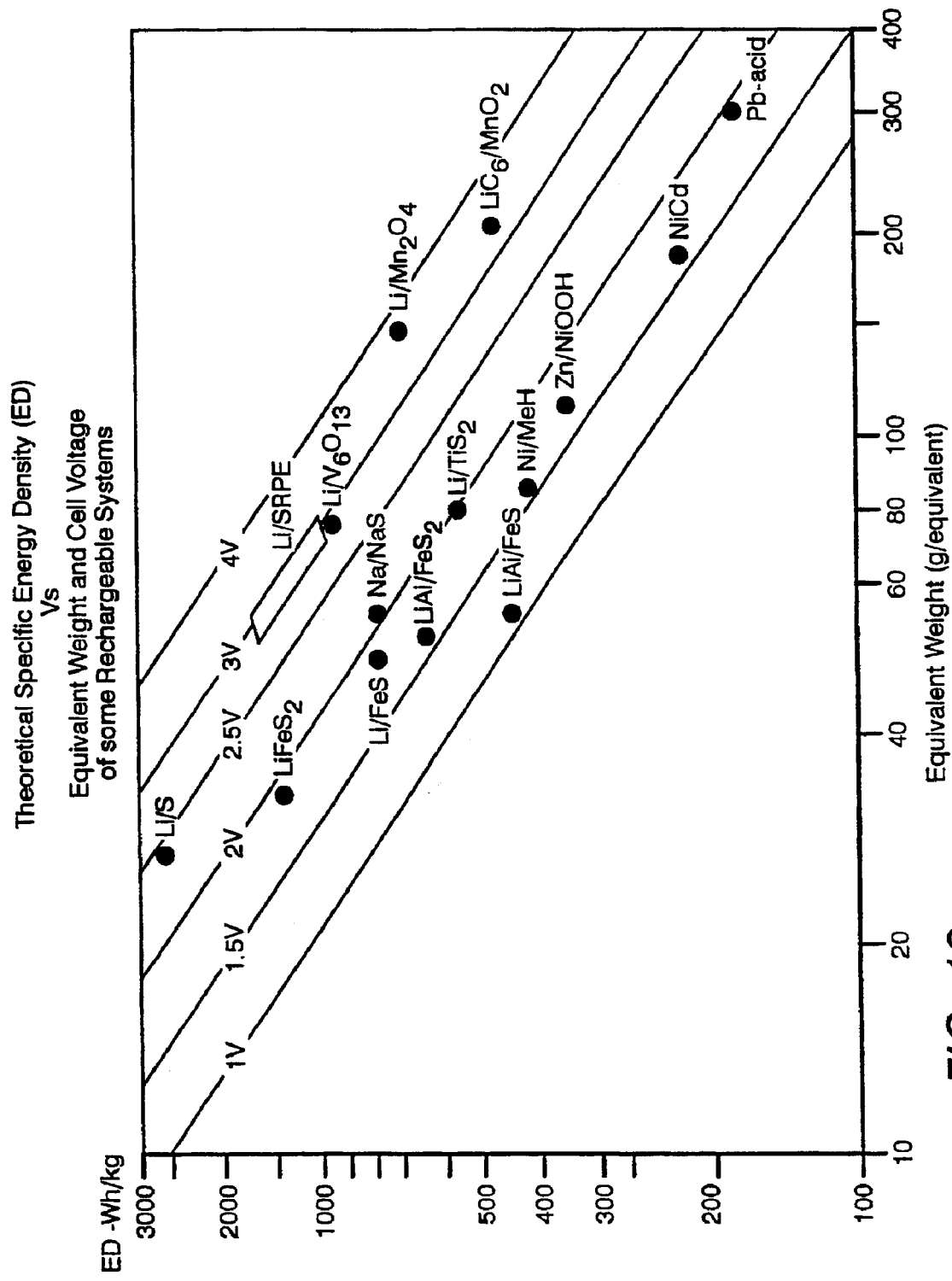
FIG. 12 is a graph showing theoretical specific energy density versus equivalent weight and cell voltage of some rechargeable battery systems.

FIG. 1 shows a method for printing a multilayer electronic component 1 in accordance with the inventive subject matter. This method comprises the following steps: providing a surface 2, providing a redox couple 3, solubilizing at least one of the redox couple constituents in the solution 4, transferring the solution to the surface 5, initiating a redox reaction 6, and completing the component by adding at least one additional layer 7.

As used herein, the term "electronic component" means any device or part that can be used in a circuit to obtain some desired electrical action. Electronic components contemplated herein may be classified in many different ways, including classification into active components and passive components. Active components are electronic components capable of some dynamic function, such as amplification, oscillation, or signal control, which usually requires a power source for its operation. Examples are bipolar transistors, field-effect transistors, and integrated circuits. Passive components are electronic components that are basically static in operation, i.e., are ordinarily incapable of amplification or oscillation, and usually require no power for their characteristic operation. Examples are conventional resistors, capacitors, inductors, diodes, rectifiers and fuses.

Electronic components contemplated herein may also be classified as conductors, semiconductors, or insulators. Here, conductors are components that allow charge carriers (such as electrons) to move with ease among atoms as in an electric current. Examples of conductor components are circuit traces and vias comprising metals. Insulators are components where the function is substantially related to the ability of a material to be extremely resistant to conduction of current, such as a material employed to electrically separate other components, while semiconductors are components having a function that is substantially related to the ability of a material to conduct current with a natural resistivity between conductors and insulators. Examples of semiconductor components are transistors, diodes, some lasers, rectifiers, thyristors and photosensors.

Electronic components contemplated herein may also be classified as power sources or power consumers. Power source components are typically used to power other components, and include batteries, capacitors, coils, and fuel cells. As used herein, the term "battery" means a device that produces usable amounts of electrical power through chemical reactions. Similarly, rechargeable or secondary batteries are devices that store usable amounts of electrical energy through chemical reactions. Power consuming components include resistors, transistors, ICs, sensors, and the like.

Still further, electronic components contemplated herein may also be classified as discreet or integrated. Discreet components are devices that offer one particular electrical property concentrated at one place in a circuit Examples are resistors, capacitors, diodes, and transistors. Integrated components are combinations of components that that can provide multiple electrical properties at one place in a circuit Examples are ICs, i.e., integrated circuits in which multiple components and connecting traces are combined to perform multiple or complex functions such as logic.

As used herein the various forms of the term "multilayered" as applied to components means that the functionality of the component arises from having juxtaposed layers of different materials. For example, a typical P-N-P transistor is considered herein to be a multilayered component because its functions arise from the juxtaposition of P and N doped semiconductor layers. Similarly, a battery is considered herein to be a multilayered component because its functions arise from juxtaposition of anode, electrolyte and cathode, and a capacitor is considered herein to be a multilayered component because its functions arise from juxtaposition of a conductor plate, a insulator, and another conductor plate. On the other hand, a conductive trace on a circuit board would not generally be considered to be multilayered even if the trace had been manufactured by successive deposits of the conductive material, because each successive layer merely increases the current carrying capacity, rather than altering the functionality of the trace.

Providing a Surface (2)

Suitable surfaces for step 2 are contemplated to be any surface upon which a layer of an electrical component can be deposited. Most likely, the surface will be the smooth top or bottom of a sheeted material such as a resinous circuit board, but all other surfaces are contemplated as long as they are capable of being printed upon.

In terms of the material defining the surface, almost any solid or semi-solid material can be used to provide a suitable surface. Particularly preferred surfaces are those defined by relatively firm substrates such as fiberglass circuit boards, glass, and metal objects. However, the scope of suitable materials is extremely wide, ranging from metals to non-metals, conductors to insulators, flexible to inflexible materials, absorbent to non-absorbent materials, and so forth. For example, other surfaces contemplated herein are the sides or tops of previously deposited or installed components, circuit traces, or layers coupled to or forming part of other circuits or components.

The surface being printed need not be hard, but may instead form part of a flexible sheet, such as that found on plastic or paper bags, or even a textile. The existence of a sheet is also not necessary, and contemplated surfaces include that found on substantially any shape, from solid blocks to hollowed out or extruded forms. Even clothing may provide a suitable surface for printing. Still further, surfaces contemplated herein can vary widely in size, from an extremely small area such as a square millimeter or less, to a large area such as a display measuring several square meters or more.

Where both an electrical circuit pattern and electronic components will be printed on a substrate, preferred substrates are generally electrically non-conductive. In general, all dielectric materials are therefore suitable substrates. Dielectric materials commonly employed comprise a resinous material. If desired, the resinous material may incorporate fibrous reinforcement. For instance, paper or cardboard, glass fiber or other fibrous material may be impregnated with a phenolic, epoxy or fluorohydrocarbon (e.g., polytetrafluoroethylene) resinous material and pressed or rolled to a uniform thickness. Ceramic substrates may likewise be selected. The substrate may be substantially uniform, or it may be doped or modified in some other manner, such as by including holes that may be formed, punched or drilled in the substrate.

Prior to use the substrate may advantageously be cleaned or degreased employing techniques well known in the art. Preferred degreasing agents are trichloroethylene and aqueous detergent solution.

Providing a Redox Couple (3)

In step 3 a redox couple is provided comprising at least two components, one oxidizing agent (oxidizer) and one reducing agent (reducer), that react together in a redox reaction. As used herein the term "redox" reaction means a reaction in which one component is oxidized and one component is reduced.

In preferred embodiments both the oxidizing and reducing species of the redox couple are included together in solution, but in other embodiments these species may be present in any phase or combination of phases. For example, a reducer present in a liquid may be coupled with a gaseous oxidizer such as oxygen.

The redox components are preferably thermodynamically stable in solution together under normal conditions, and chemically react with one another only under the influence of an external energy source. In that manner the reaction is said to be initiated by the external energy source. Redox reactions useful herein are also generally preferred to be highly exothermic, such that the components react substantially to completion upon initiation of the reaction, as opposed to requiring the external energy source to drive the reaction through to completion. On the other hand, it is contemplated that the redox reaction may range down to only slightly exothermic, and may even be endothermic.

Preferred redox systems are those which have an appropriate activation energy, usually at about 220° C. to about 550° C., and that react substantially to completion under the reaction conditions without reacting too violently. Thus, for example, some redox systems would be explosive under the expected conditions, and are therefore highly disfavored. Other disfavored redox systems may not be explosive, but are still so reactive that excess heat production is problematic. Nevertheless, it is preferred that the redox couple will include both a strong oxidizing agent and a strong reducing agent.

Preferred redox reactions result in a metal, metal oxide, or other substance precipitating out from a solution. In especially preferred embodiments one component of the solute comprises a salt, while another component of the solute comprises an appropriate ligand. As used herein the term "salt" means any combination of an acid (A) and a base (B). Examples of metallic salts are copper formate, nickel acetate, aluminum acrylate, gold thiocyanate, and titanium iodide. Examples of non-metallic salts are ammonium formate and ammonium acrylate. Additional useful ions include nitrate, alkoxide nitrate, alkoxide perchlorate, acetate nitrate, and acrylate nitrate. Precipitation of multiple precipitates from the solution onto the substrate may occur concurrently or sequentially, or in some combination of the two.

Where the salt contains a metal, all metals are contemplated. Preferred metals, however, are conductors such as copper, silver, and gold, and semiconductors such as silicon and germanium. For some purposes, especially production of catalysts, it is contemplated that metals such as cadmium, chromium, cobalt, iron, lead, manganese, nickel, platinum, palladium, rhodium, silver, tin, titanium, zinc, etc. can be used. As used herein, the term "metal" also includes alloys, metal/metal composites, metal ceramic composites, metal polymer composites, as well as other metal composites. Of course, where the redox couple contains metal salts, the precipitate may be capable of conducting current through the flow of electrons. It is also contemplated, however, that the redox couple may comprise compounds that are capable of conducting current by ions, as is the case in solutions of acids, bases, and salts in many fused compounds.

Preferred redox systems are also those which generate a gaseous or liquid product which is readily removed from the solution. To this end redox systems are preferred that produce a gas, such as $NO_x$, $SO_x$, $CO_x$, $N_2$ and $N_2O$, or that produce water, alcohol or other readily evaporated substance.

In many instances the redox system will comprise a simple redox couple, such as nitrate and acetate. While it is possible that one or more of the metal salts will have a reducing ligand, and the oxidizing agent may be provided separately, it is preferred that at least one of the metal salts will have an oxidizing ligand, and that the reducing agent will be separately added to the solution. Preferred reducing agents for this purpose are organic acids, including non-polymerizing carboxylic acids such as formic acid, citric acid, and ascorbic acids. Polymerizing organic acids such as methacrylic, acrylic, crotonic acid, etc. may also be used, although such acids may combine to produce a product which is difficult to separate from the mixed metal oxide product.

In more complex redox systems, there can be combinations of oxidizing and/or reducing agents. Combinations of acids, for example, can be used as reducing agents. Contemplated examples of complex redox systems include tartaric acid and ascorbic acid.

Just as the metals in the metal salts are preferably included in stoichiometric proportions to produce the intended mixed metal oxide, the various ligands employed in the redox system are preferably included in stoichiometric proportions to react completely with each other.

As used herein the term "ligand" (L) refers to any substance which can be thermally activated to displace one or more aspects of the salt in a redox reaction, such that AB+L=>AL+B, or AB+L=>A+BL. In processes contemplated herein-preferred ligands are non-crystalline, leave no non-metallic residue, and are stable under normal ambient conditions. Preferred salts contain ligands that react in solution at temperatures of ≦300E C, more preferably ≦250E C, and still more preferably ≦200E C.

Preferred classes of ligands are nitrogen donors, including especially cyclohexylamine. A number of other nitrogen donors and their mixtures, however, may also be used. Examples are 3-picoline, lutidines, quinoline and isoquinoline, cyclopentylamine, cyclohexylamine, cycloheptylamine, cyclooctyl amine, and so forth. These are only a few examples, however, and many other aliphatic primary, secondary and tertiary amines and/or aromatic nitrogen donors may also be used.

In an exemplary class of embodiments, mixed metal oxides of the form MpIMqIIMrIII . . . O(p/2+q+3r/2) can be produced by heating an aqueous mixture of metal nitrates and carboxylic acids at low temperature. The formation of the metal oxide under these conditions is thought to be facilitated by spontaneous reaction between the oxidizing $NO_3$-/$NO_2$ and the organic ligands such as acrylate, methacrylate, formate, citrate, acetate, ascorbate, picolinate, salicylate, etc. A significant advantage of a nitrate-carboxylate system is the ability of these systems to undergo pyrolysis in an ordinary household microwave oven to give the ceramic, which may then be sintered to get the final product.

Solubilizing At Least One of the Redox Couple Components in Solution (4)

In step 4 one or more components comprising the redox couple are combined with a suitable solvent or mixture of solvents, and possibly other solutes to form a solution. Suitable solvents are substances capable of dissolving another substance to form a uniformly dispersed mixture at the molecular- or ionic-size level. This includes any combination of polar or nonpolar, organic or inorganic, viscous or non-viscous, aqueous or non-aqueous, protic or aprotic. Exemplary solvents are water, any of the alcohols, aromatic hydrocarbons, esters, ethers, ketones, amines, and nitrated and chlorinated hydrocarbons. Although water is generally preferred to minimize environmental pollution, it is contemplated than many embodiments are preferably practiced using an organic such as NMP.

Solutes that are incapable of being solubilized into the solution may also be included in the solution, including ceramic particles, metal particles, and polymers. Such solutes are designed to be incorporated into the solution as a "suspension" or "dispersion". "Suspension" is defined as a system in which very small particles (solid, semi-solid, or liquid) are more or less uniformly dispersed in a liquid or gaseous medium. "Dispersion" is defined as a two-phase system where one phase consists of finely divided particles distributed throughout a bulk substance wherein the dispersion is seldom uniform.

Contemplated solutions may include other compounds besides salts and ligands. For example, a mixture of copper (II) formate in a nitrogen donor solvent with or without water may be combined with an alcohol to facilitate dispensing in an ink-jet type printer. A small amount of a solvent based polymer or a surfactant may also be useful as additives for adjusting the rheology of the precursor solution for ink-jet printing, and to impart better film forming properties. On the other hand, larger amounts of high boiling solvents and/or additives such as triethylphosphate, Triton X100, glycerol, etc., are preferably avoided as these have a tendency to contaminate the film produced on account of incomplete pyrolysis over temperature sensitive substrates such as Kapton™ or paper. Still further, it may be worthwhile to treat the substrate with a coupling agent that improves adhesion of the deposited material to the substrate.

The most preferred solvents, however, leave little or no residue other than the metal, metal oxide or other intended precipitate. Thus, when depositing pure metals as in current collectors or circuit traces, any binders, surfactants, viscosity modifiers, and so forth that may be used are preferably present in the solution in collective concentrations ≦20 wt %, ≦10 wt %, ≦5 wt %, or ≦2 wt %. Thus, while it is contemplated for the deposited solution to include particulates, such particulates are preferably present in the given solutions at ≦20 wt %, more preferably ≦10 wt %, more preferably ≦5 wt %, and still more preferably ≦2 wt %. It is also contemplated for the deposited solution to be substantially particulate free.

On the other hand, when depositing layers that advantageously include particulates, such as cathodes or anodes in which particulate inclusion is desirable to achieve increased surface area, greater amounts of precipitates are contemplated. For example, in depositing cathode or anode layers it is contemplated that particulates may advantageously provide 60 wt % –80 wt % of the dry formulation, which may correspond to about 40 wt % –50 wt % of the composition when diluted by solvent.

The preferred viscosity of the deposited solution depends largely upon the method being used to deposit the solution on the substrate. Preferred apparent viscosities are 1.5 to 10 cps (centipoises) for ink jet type dispensers, 30,000 cps for silk screening, between about 300–20,000 cps for offset, lexographic, gravure and intaglio.

The solvent can be separated from the mixed metal oxide product in several different ways. In preferred embodiments the redox reaction is carried out until a substantial increase in viscosity is attained, during which time the solvent is largely evaporated from the reacting mixture. In other embodiments, the solvent can be by continuing to heat the deposited solution.

Applying the Solution to the Surface (5)

In step 5 the solution is applied to the surface using any device capable of forming a desired pattern. Generally, this occurs by dispensing the solution onto a surface through relative movement between the surface and at least some portion of the device. Conceptually, the device can include two parts, a reservoir for holding the solution, and an applicator. In one class of preferred embodiments, for example, the device can be a "point" dispenser such as an ink jet type printer cartridge, a capillary nib, a roller dispenser, a sprayer, or even the end of a compacted mass similar to a pencil lead. In such embodiments, the reservoir is a holding tank for the dispensed fluid, while the applicator is some form of drawing head. Depending on the specific embodiment, such devices can dispense substance with an accuracy anywhere from tens of Angstroms or less, to a millimeter or more.

It is not necessary for the reservoir to be fluidly or even mechanically coupled to the applicator. For example, the applicator may comprise a rubber or lithograph type stamp, and the reservoir may comprise a stamp pad. In such embodiments, there need not be any relative movement at all between the surface and the reservoir, and instead a relative movement between the applicator and the surface can be used to form the desired pattern. In still other embodiments, the applicator need not translate bodily relative to the surface, but may tilt or rotate to produce the desired pattern. In still other embodiments, both the reservoir and the applicator may be immobile relative to the surface, and the fluid dispensed through the applicator may be directed by pneumatic, magnetic or other forces to form the desired pattern.

The patterns contemplated to be dispensed using apparatus and methods described herein include any arrangement of points or dots, whether isolated or combined to form lines, filled in spaces and so forth. Thus, contemplated patterns include straight and curved lines, intersections of lines, lines with widened or narrowed areas, ribbons, overlapping lines. It is especially contemplated that useful patterns may include circuit board and circuit component designs. The patterns may also be single or multi-layered designs, and may involve printing on one or both sides, with vias being printed to interconnect the two sides.

Virtually any type of printing device may be employed in the present subject matter. All common methods of printing are contemplated, including the following technologies, some of which may overlap with one another ink jet printing; thread dispensing; spraying; stamping; all types of lithography or wet offset; dry offset or letterset; roller printing; letter press printing; gravure printing; screen printing; flexographic printing; planographic printing; offset printing; mimeo graphic printing; thermography; hot stamping and transfer printing techniques; as well as brushing and stenciling techniques. In short, any printing process that uses inks can be employed effectively with embodiments of the present teachings.

For prototypes and very small volumes, inkjet type printers may be advantageously employed. Ink-jet printing is already known in the production of printed circuit boards using silver, copper, lead or tin containing conductive inks. Discussion of exemplary such techniques may be found in U.S. Pat. No. 5,688,146 to McGinley et al. (Nov. 18, 1997), which is incorporated in its entirety. Similar techniques, but with the dissolved redox solutions contemplated herein, may be used. Details of preferred procedures utilizing an ink-jet type printing apparatus are set forth in copending U.S. patent application Ser. No. 09/042,182 to Narang et al. (March 1998), and U.S. patent application Ser. No. 09/105,858 to Narang et al. (June 1998), both of which are incorporated herein by reference.

The use of ink-jet printing technology also expands the horizons by enabling fabrication of power sources of flexible size and shape that can be conformal to various surfaces including curved surfaces. Furthermore, a resolution down to 10 $\mu$m, and even 5 $\mu$m is possible with present ink-jet printing devices, and is likely to be improved with further advancements in ink-jet printing technologies. Still further, CAD/CAM can be used to control the application of the layers, allowing both excellent control of the printing devices, and highly flexible system design.

For somewhat larger runs, such printers may be operated in conjunction with an XY$\theta$ production table, such as that described in U.S. Pat. No. 4,981,074 to Machita et al. (January 1991). An especially preferred category of printing devices includes CAM type direct writing systems, such as an Ohmcraft, Inc. Micropen 400. In that device, the pen, table and material pumping system are under direct, interactive, synchronous computer control at all times, and each of the variables, (writing speed, pumping rate, pen force, deposit thickness, deposit width, column per unit length and column per unit time), may be individually programmed. The solution being deposited is pumped to the pen tip, and deposited in pulses of about $2.7 \times 10^{-7}$ ml. The pen rides on the surface of the solution being extruded, and need not touch the substrate during writing. This permits all contours of the substrate to be followed, while providing constant thickness if desired. Fine line patterns can be produced at 4 mil or less, with 5% tolerance.

By employing continuous substrate, such as may be drawn from a roll of metal foil or paper, it is also possible to print a large number of identical circuits at high speeds of tens of meters or more per minute. Such circuits can then be separated from one another, such as by cutting with a suitable blade. In an especially preferred embodiment, a printing machine may be employed that has multiple substantially independent printing stations. An example is the Comco Commander™ from Comco International, (Milford, Ohio). With such machines an entire circuit, including circuit traces and many different electronic components, can be printed on a continuous substrate such as a polymer sheet. In such a system, different solutions of material may advantageously be deposited at different stations, in a manner analogous to depositing different colors in a multicolor printing process. Alternatively, a given station may have multiple deposition jets or other deposition devices for printing a plurality of different solutions.

Initiating a Redox Reaction (6)

In step 6 a redox reaction is initiated in the deposited solution. In preferred embodiments, the reaction is initiated by application of external energy, with suitable energy sources including any source that is capable of effecting the desired chemical reaction(s) without causing excessive damage to the substrate or the coating. Particularly preferred energy sources are microwave generators, although radiative and convection heat sources, such as info lamps and hot air blowers may be used as well. Other suitable energy sources include electron beams, and radiative devices at non-IR wavelengths including x-ray, gamma ray and ultra-violet.

Alternatively, the redox reaction may occur spontaneously, such as where oxygen or other gas in the atmosphere reacts with a component in the deposited solution. In that case there may be no need to initiate the reaction using an external energy source.

In our experiments reacting small quantities of materials, we have been most successful using microwave energy for this purpose. In such experiments the solution has generally been deposited on a glass surface, and the microwaves have been provided using a common household microwave having a rated capacity of 1100 watts. Under the concentrations discussed above, microwave energy for about 10 minutes is generally sufficient to initiate many redox systems, during and after which the reaction is self-perpetuating due to the exothermic nature of the reaction. We have also had good results using radiative or convective heat, such as that produced by a hot plate. Still further, other energy sources such as ultraviolet light, $CO_2$ laser, diode laser, infra red lamp, solar energy, and electric current are contemplated. Of course, the amount and intensity of the activating energy is also a function of other reaction conditions, and it is contemplated that strong energy sources can reduce the redox reaction time to the order of seconds, or even less.

Following initiation of the redox system, the temperature of the mixture during processing can fall anywhere between about 50° C. and about 500° C., and may vary or remain constant during processing. It is further contemplated that the reaction time will fall within the several minutes to several days range, and even possibly several seconds. Stirring or other mixing is clearly advantageous during the reaction to increase homogeneity of the final product, but there are wide limits on such mixing. In some cases, especially when polymerizing acids are used it may be advantageous to age the contents for a short period ranging from an hour to several hours. However, over-aging may be avoided to preclude the possibility of phase separation.

Where external energy sources are used to initiate the reaction, they may be applied in various ways. In preferred embodiments the energy source is directed at the precursor/ ligand deposited on the substrate. However, in alternative embodiments, for example, a heated ligand could be applied to a cold precursor, or a heated precursor could be applied to a cold ligand. In still other embodiments, the substrate itself could be heated, and energy imparted into the solution by heat conduction.

As noted elsewhere herein, it is preferably not necessary to drive the redox reaction to completion using an external energy source, and instead the external source is merely employed to Nevertheless, post processing of individual layers is contemplated. For example, where an undesirable amount of solvent remains in the precipitate, additional energy may be employed to drive off some or all of the remaining solvent. In other instances, especially where metal oxides are concerned, calcining may be needed to achieve the desired functionality.

Completing the Component (7)

Step 7 adds another layer to the electronic component 1, preferably after the redox reaction is substantially completed in the previous layer. In some instances, however, the additional layer can be added even earlier, such as where the solutions of the two layers are relatively immiscible in one another, or intermixing is deemed to be acceptable, or even desired.

It is contemplated that up to ten or more additional layers may be needed to complete all of the circuit elements in a circuit, depending on the complexity. However, as described below, most circuit elements can be constructed with only three to four layers, and it is probably rare to need more than about ten layers.

There are numerous possibilities for additional layers. Additional layers may comprise either the same material as, or a different material from that deposited immediately below. This includes conductors, insulators, semi- conductors, electrolytes, and so forth as discussed elsewhere herein, or perhaps simply a seating layer such as a non- conducting polymer protectant. Additional layers may also form "lead lines". The additional layer(s) need not even be deposited in accordance with the teachings herein.

FIGS. 2–7 depict some of the many contemplated designs for specific electronic components. In FIG. 2, a capacitor 20 has a first (nearest to substrate) layer with two leads 8 separated by supporting insulator 9, wherein one of the leads is enlarged at plate 22; a second layer having an insulator 24, another layer of supporting insulator 9 and a conductive riser 25; and a third conductive layer enlarged to form plate 26.

Throughout these examples, the leads 8 form part of a circuit, the details of which will vary from circumstance to circumstance, and which are therefore shown only in imme- diate proximity to the components. Suitable leads, and indeed any of the conductors may include any of the metals or other conductors discussed herein, but preferably consist of substantially pure copper, and may be formed using the techniques of example 1 below. In addition, throughout these examples, the supporting insulator layers 9, as well as any other insulating layers, may be formed using the tech- niques of example 2 below.

In FIG. 3, a diode 30 is formed from a first layer having two leads 8 separated by supporting insulator 9; a second layer having a p doped semiconductor material 32, another layer of supporting insulator 9, and a layer of conductive riser 33; a third layer having an n doped semiconductor material 34, another layer of supporting insulator 9, and a layer of conductive riser 33; and a fourth layer having a conductor 35. Throughout this discussion, n and p doped semiconductor layers may be formed using known semicon- ductor materials and dopants, solvated and deposited in accordance with the teachings herein.

In FIG. 4, a transistor 40 is formed from a first layer having two leads 8 separated by supporting insulator 9; a second layer having a p doped semiconductor material 42, another layer of supporting insulator 9, and a layer of conductive riser 43; a third layer having an n doped semi- conductor material 44, another layer of supporting insulator 9, and a layer of conductive riser 43; a fourth layer having a p doped semiconductor material 45, another layer of supporting insulator 9, and a layer of conductive riser 43; and a fifth layer having a conductor 46. The p and n layers may be formed as in the diode 30.

In FIG. 5, a resistor 50 is formed from a first layer having two leads 8 separated by supporting insulator 9; a second layer having two risers 53, and another layer of supporting insulator 9; and a third layer having a resistive material 54. The resistive material 54 may be formed using known resistive materials, solvated and deposited in accordance with the teachings herein. Of course, the resistive material could simply be butt-joined with the leads 8, but such an arrangement is thought to be less reliable.

In FIGS. 6A and 6B, an inductor 60 is formed from a first having two leads 8 separated by supporting insulator 9, where one of the conductive leads 8 is continuous with a three sided conductive extension 62; a second layer having riser portions 63, a layer of insulator 64 and supporting insulator 9; and a third layer having a conductor 64. Obviously, the leads 8, extension 62, riser portions 63, and conductor 64 are all electrically conductive and continuous.

In FIG. 7, a battery 70 is formed from a first layer having two leads 8 separated by supporting insulator 9; a second layer having cathode material 72, another layer of support- ing insulator 9, and a conductive riser portion 73; a third layer having an electrolyte material 74, another layer of supporting insulator 9, and a conductive riser portion 73; a fourth layer having an anode material 75, another layer of supporting insulator 9, and a conductive riser portion 73; and a fifth layer 76 comprising an electrically conductive col- lector material 76. The cathode may advantageously be formed using 50 wt % to 70 wt % in n-methyl-pyrrolidone (NMP). The electrolyte layer may advantageously be formed using polyvinylidene flouride (PVDF), ethylene carbonate, dimethyl carbonate, lithium hexafluorophosphate, and optionally inert particles such as polyethylene, silicon carbide, and alumina.

The anode layer may advantageously be formed using 50 wt % to 70 wt % lithium cobalt oxide in n-methyl- pyrrolidone. Additional details of battery formation are described below in connection with the discussions of FIGS. 10 and 11. Of course, In FIG. 8, a composite component 80 comprises a com- bination battery and capacitor. The battery portion is formed as in FIG. 7, with a first layer having two leads 8 separated by supporting insulator 9; a second layer having cathode material 82, another layer of supporting insulator 9, and a conductive riser portion 83; a third layer having an electro- lyte material 84, another layer of supporting insulator 9, and a conductive riser portion 83; a fourth layer having an anode material 85, another layer of supporting insulator 9, and a conductive riser portion 83; and a fifth layer 86 comprising an electrically conductive collector material 86. The capaci- tor portion is formed substantially as in FIGS. 2A and 2B, with the fifth layer having the collector material 86 acting as a plate, another layer of supporting insulator 9, and yet another conductive riser portion 83; and a sixth layer having another electrically conductive plate 88.

Electronic Devices

Methods and apparatus taught herein may be used to produce circuits and components used in essentially any field of the modern world, from communications to computing, transportation, energy production, storage and control, consumer goods, radios, navigation, and so forth. Numerous advantages are contemplated, including reduction of system weight and volume by minimizing the electrical interconnects and packaging, and by employing thinner layers of material that do not have to withstand the mechanical rigors of conventional fabrication techniques. Our approach thus provides an increase in the specific energy and specific power for a wide range of integrated apparatus, including devices in the fields of hybrid electronics and microelectronics.

One class of contemplated embodiments includes relatively simple circuits that often command fairly low prices, but are produced in hundreds of thousands or even millions of units. Exemplary products are battery testers, sensors, catalysts, small batteries, micro-actuators, and devices that employ numerous electrical contacts, such as computer keyboards. As a particular example, methods taught herein may be employed to produce a sensor such as the oximeter described in U.S. Pat. No. 5,041,187 to Hink et al. (August 1991).

Another class of specifically contemplated embodiments includes mass-produced, relatively inexpensive devices having a large number of contacts. Examples here include keypads for computers and the like. A membrane keyboard similar to that described in U.S. Pat. No. 5,011,627 to Lutz et al. (April 1991), for example, may be readily produced according to methods described herein. Such circuits are expected to be superior to that previously known because the traces can be deposited without particulates, using a molecularly homogeneous solution. This advance should allow greater flexibility and crack resistance.

Another class of specifically contemplated embodiments includes circuits printed on flexible substrates such as clothing or other fabrics. The circuit of the theft detection tag described in the Isen patent discussed above, for example, may be produced according to the methods taught herein. Moreover, using techniques described herein, conformal devices may advantageously include advanced batteries, advanced electronics, and functional devices. Thus, in some contemplated embodiments a battery or fuel cell may advantageously can be printed on a curved object, such as a balloon or the inside of a pressure vessel containing a fuel gas.

Still another class of specifically contemplated embodiments includes batteries and fuel cells, and combinations of such cells with transmitters, receivers and the like. The batteries may find particular usefulness in conjunction with cellular telephones, radios, and other communication devices, as well as systems that employ the button type batteries, such as digital watches.

The ink-jet printing process 90 shown in FIG. 9 is particularly useful in building up a power source structure and ultimately a battery/functional device combination. Here, the head 92 of an ink-jet type device (remainder not shown) deposits a solution (not shown) containing a redox couple as described elsewhere herein onto a substrate 94. The substrate 94 with deposited solution is then subjected to an IR lamp or $CO_2$ laser energy source 96, which initiates the redox reaction.

FIG. 10 illustrates a multilayer structure for a lithium ion type battery 100 that may be produced by the process of FIG. 9. This particular example represents a lithium ion type battery, having a typical battery voltage of 3.7 V nominal and 4.2 V top of charge. Lithium ion chemistries are preferred because they typically give the highest specific energy of any of the current commercially available batteries. Of course, a similar approach can be used to produce other types of batteries, capacitors and fuel cells.

In FIG. 10, the battery capacitor combination 100 includes an anode 101 with anode current collector 102, a cathode 103 with cathode current collector 104, and an electrolyte layer 105. Each of these layers is advantageously between 3 cm and 20 cm wide, 3 cm and 500 cm long, and 100 $\mu$m to 150 $\mu$m thick, except that the current collector 104 is typically about 0.5 $\mu$m thick. On top of the cathode current collector 104 is a barium titanate ceramic layer 106 with copper points 107, which are contemplated to be 25 $\mu$m to 150 $\mu$m thick. Leads 8 are also show for charging or discharging the battery capacitor combination 100.

The anode 101 may advantageously comprise coke or graphite, to which a PVDF binder has been added, and to which a copper collector may be coupled. In conventional batteries, the collector is generally limited to foils with good mechanical properties to allow for the mechanical stresses during the coating process. In approaches contemplated herein, however, a much thinner copper or other current collector can be used because the current collector does not require mechanical strength to withstand the coating process. This thinner current collector provides a weight saving, thus improving the specific energy of the battery.

The cathode 103 preferably includes lithium cobalt oxide (lithium ion source), acetylene black (to enhance the electronic conductivity), and a polymer binder. In approaches contemplated herein, a thinner current collector 104 can be used. With the fabrication of thinner electrodes, a lower level of acetylene black may be required.

Preferred cathode materials are mixed metal oxides, in which different metals are bound together with oxygen in the same molecule. Such compounds are particularly advantageous in the production of secondary battery electrodes, where the life and energy efficiency of the battery depend to a great extent upon the morphology and composition of the electrodes. As used herein, the definition includes compounds having the general formula, $M^1_{x1} \ldots M^n_{xn}O_y$, where $M^1_{x1} \ldots M^n_{n2}$ represents n different metals, and the various metal and oxygen species are present in relative atomic ratios given by x1 . . . xn and y, respectively. The definition also includes $M^1_{x1} \ldots M^n_{xn}O_y$ compounds that are "doped" by inclusion of other non-homogeneously distributed chemical species, such as metal, ceramic or other particulates, as well as the hydroxide and hydrated forms of such compounds. The definition of mixed metal oxides used herein does not, however, include compositions in which individual mono-metallic metal oxides are merely present as a solid— solid or other mixture, rather than being chemically bonded together. The definition also does not extend to compounds such as metal alkoxides and alkanolamines.

Especially preferred mixed metal oxides are those claimed in copending PCT patent application ser. no. PCT/US98/13366 to Narang et al., (June 1998), which is incorporated herein by reference. Most preferred mixed metal oxides are the lithiated metal oxides, $LiM^p_IM^q_{II} \ldots O_x$, (including, for example, $LiAl_{0.2}Mn_{1.8}Ox$, $LiCoO_2$, and $LiMn_2O_4$) which are increasingly used in the so-called re-chargeable rocking chair batteries. In such devices the metal oxides act as cathode materials by reversibly intercalating and deintercalating lithium during repetitive discharging and charging.

In addition to their use in batteries, mixed metal oxides as set forth in PCT/US98113366 are also of particular interest in many of the applications contemplated herein because the presence of different metals often imparts special properties to the compound. Barium Titanate ($BaTiO_3$), for example, is widely used in capacitors, transducers, thermistors and so forth, Yttrium Barium Copper Oxide ($YBa_2Cu_3O_x$) and other mixed valent spinels have been investigated as superconductors, and lithium niobium oxides ($LiNbO_3$) have been investigated as ferro-electric materials.

The electrolyte 130 may advantageously comprise a lithium salt. In previously known mechanical assembly of batteries, this layer has usually been at least 50 $\mu$m (2 mil) thick. In approaches contemplated herein, however, due to the direct application of the electrolyte to the surface of the electrode, a much thinner electrolyte layer is possible. Contemplated thicknesses are 10 $\mu$m to 25 $\mu$m which provides a weight saving and lowers the battery resistance (a thinner ionic layer between the electrodes). Both of these factors increase the specific energy of the battery, with the lower resistance improving the battery performance in particular under high current drain conditions.

While liquid electrolytes are contemplated, preferred electrolyte materials are substantially non-fluid electrolytes such as polymer electrolytes, and especially non-flammable/self extinguishing solvent electrolytes such as those disclosed in U.S. Pat. No. 5,830,600 to Narang et al. (November 1998), and in presently pending copending U.S. patent application ser. No. 60/067,226 to Narang et al., filed December 1997, both of which are incorporated herein by reference.

With polymer type electrolytes it is also contemplated to employ plasticizers that decrease resistance. Preferred plasticizers are fashioned after the teachings of U.S. Pat. No. 5,102,751 to Narang et al. (April 1992), which is incorporated herein by reference.

In addition to that already discussed, additional advantages are possible at the battery-system level, as well as improvements in the packaging, and integration of the packaging and the device. A still further enhancement of the battery electrode structure is in possible if a high power level (current drain) is required. For example, the battery 110 of FIG. 11 has interdigitated electrodes 111 and 112. This structure improves electrode utilization and power per unit electrode. Additional electrode improvements are set forth in pending U.S. patent application Ser. No. 09/089,313 to Narang et al. (June 1998).

FIG. 12 is a graph referencing other battery chemistries, all of which may be employed in conjunction with the teachings herein.

Other Devices

Other devices besides electronic circuits and components can be advantageously manufactured according to the teachings herein. For example, methods and apparatus taught herein may be used to produce surface coatings for decorative purposes, such as decorations on the tanks of motorcycles or the sides of cars and buses and trucks. For such applications, an ink jet type printer with head movement controlled in three dimensions may be used.

In another class of embodiments which need not be associated with electronics per se, the methods and apparatus taught herein enable the fabrication of high performance ceramic films not attainable by other commercially available printing techniques. By way of example, a high dielectric constant ceramic device can be fabricated by depositing a slurry of barium titanate in an organic solvent with a polymer hinder to enable the formation of a high quality film. Chemical precursors to barium titanate (barium alkoxide and titanium alkoxide) can be added to the solution to enhance the ceramic yield and thereby produce a high dielectric constant ceramic film via low temperature baking of the film.

Techniques described herein can also be used in depositing gold and palladium using a non-vacuum, non-electroless, non-electroplating high-speed process integrated for electrical interconnects. This technology has been extended to deposit copper and rhodium for multichip modules and rigid, rigi-flex, and flexible, printed wiring board applications by ink-jet printing. The technology can deposit several metals onto a variety of substrates such as metals, ceramics, Kapton® and paper.

Experimentation with these techniques has resulted in the deposition of gold, copper, palladium, and rhodium films onto a range of substrates with excellent characteristics. Among other things, the deposits are advantageous in that they: (a) have substantially any desired thickness; (b) are free from pores and cracks (as evaluated by SEM EDAX); (c) are continuous and electrically conducting; (d) have a high surface smoothness, shine, and integrity; and (d) have good adhesion to the substrate.

These characteristics provide numerous advantages, from which many electronic and non-electronic applications not specifically mentioned herein will be readily apparent to those of ordinary skill in the art. By way of further guidance, the deposition techniques described herein are advantageous in that:

They can be practiced without resort to vacuum metal deposition procedures;

They require no resist for patterning;

CAD/CAM data can be used to control the deposition with coating techniques such as inkjet printing;

They yields metal coating performance equivalent or superior to the electroplated coatings in terms of appearance, durability, lubricity, and surface integrity;

They can use low temperature deposition process, and can therefore be used on a wide range of substrates with the service range of 80°–250° C.;

They are based on easy-to-synthesize, air-stable metal complexes that: (1) are soluble in benign solvents, such as isopropyl alcohol and ethyl acetate; (2) have good film forming properties; (3) have low thermal decomposition temperatures; and (4) can be decomposed to yield metals by irradiation by appropriate coherent or non-coherent radiations, such as infrared, UV, $CO_2$ laser, argon ion laser, and IR lamp;

They can be used to deposit both thin and thick films;

They can be made environmentally benign, with $CO_2$, $H_2O$, and $N_2$ making up the major constituents of the waste stream;

They can provide air-stable metal precursors with (a) high solubility, making the solutions easy to dispense onto the substrate; (b) facile decomposition by thermolysis/photolysis; (c) high metal loading; (d) high stability at room temperature; and (e) reasonable shelf life;

They are compatible with almost any printing techniques; and

They are compatible with thermally or photochemically assisted decomposition.

EXAMPLES

Example 1

Copper Traces

Copper traces can be prepared by depositing a solution of copper (II) formate in conjunction with a nitrogen donor molecule. 2.0 g of copper (II) formate tetrahydrate was taken in a 100 ml round bottom flask and 6.8 g of cyclohexylamine was added to it. The mixture is stirred at room temperature (25–30° C.) for about 5 to 6 days to obtain a homogeneous viscous mass. Another 0.5 g of cyclohexylamine was added and stirring continued for another 24 hours, a thick paste was obtained. The viscosity of the solution was modified by adding an approximately 2 g of cyclohexylamine. The solution was dispensed using an ink-jet type printer in lines approximately 25 μm wide and 0.2 μm high. The deposited solution was then microwaved for 10 seconds, yielding substantially pure copper traces.

Example 2

Insulators 4.5 g Kynar 721 PVDF is used to dissolve the binder in 5.6 g of NMP. The mixture is heated to 120° C. to ensure the PVDF dissolves fully. 97 g aluminum oxide powder was added. The slurry is mixed for 12 hours. The viscosity of the slurry is adjusted using NMP depending on the printing method.

Example 3

Dielectrics

In a particular example barium titanate dielectric materials can be produced. 10 g of titanium (IV) isopropoxide in 30 ml of isopropyl alcohol in a 100 ml round bottom flask with a stirrer bar. In a 50 ml beaker 4 g of isobutyric and 5.5 g of acrylic acid dissolved in 20 ml of isopropyl alcohol. This solution of mixed acids was slowly added to the stirring solution of titanium (IV) isopropoxide prepared above. Stirring was continued for three hours at room temperature. A clear solution is obtained. 23.2 ml of the resulting solution was taken and added to a solution of 7 g of barium perchlorate was dissolved in about 80 ml of isopropyl alcohol. This mixture is allowed to stir for 1 hour to obtain a clear solution. This clear solution is printable.

Example 4

Mixed Metal Oxides

Mixed metal oxides can be prepared by taking an aqueous mixture of the metal nitrates and acrylic acid followed by low temperature pyrolysis to yield the metal oxide free from organics. The relative amounts of the metal nitrates and the unsaturated carboxylic acids can be adjusted to effect a complete oxidation of the organics at low temperature. A short sintering session may be required to improve the crystallinity. The method has been successfully used to prepare doped and undoped metal oxides of the type, $LiAl_{0.2}Mn_{1.8}O_x$, $LiCoO_2$, $LiMn_2O_4$, etc.

In a particular experiment, 46.46 g of $Mn(NO_3)_2 \cdot 4H_2O$ was dissolved in about 90 ml of water in a 400 ml glass beaker. To this solution 21.60 g of acrylic acid was added. The contents was stirred for about 1 hour. 6.89 g of lithium nitrate was added and the solution stirred until the material dissolved. 7.5 g of $Al(NO_3)_3$ was added and the solution stirred for 14 hours at room temperature. The sample can be printed as in example 1, with the printed solution decomposed to the metal oxide using microwave heating.

Similar procedures can be used to dope a wide range of metal oxides, for example, $LiMn_2O_4$, with dopants from the metals of groups IB, IIB, IIIA&B, IVA&B, VA&B, if VIA&B, VIIA and VIII and the lanthanides and the actinides.

Example 5

Battery Cathode 4.5 g Kynar 721 PVDF is used to dissolve the binder in 5.6 g of NMP. The mixture is heated to 120° C. to ensure the PVDF dissolves fully. 89 $LiCoO_2$, 1 g Chevron acetylene black and 5.5 g of Lonza KS6 graphite are added. The slurry is mixed for 12 hours. The viscosity of the slurry is adjusted using NMP depending on the printing method. The above mixture was screen printed.

Example 6

Electrolyte 1.4 g of Kynar 721 PVDF is dissolved in 8.6 g of a 2 to 1 mixture of ethylene carbonate: dimethyl carbonate which contains 1 M lithium hexafluorophosphate by heating the mixture to 105° C. for 30 minutes. 1 g polyethylene powder was added to the mixture and the slurry mixed for 1 hour. The mixture can be printed onto an electrode surface.

Example 7

Battery Cathode 2.96 g of titanium (IV) nitrate and 2.84 g of Titanium (IV) isopropoxide were dissolved in 35 ml of isopropyl alcohol. The mixture was stirred for 2 hours. Ink jet printing followed by $CO_2$ laser decomposition provided a thin film of $TiO_2$.

CONCLUSION

Specific embodiments and applications of the formation of circuits and multilayer electronic components have been disclosed, as well as components for other applications. It should be apparent, however, to those skilled in the art that many more modifications besides those already described are possible without departing from the inventive concepts herein. The inventive subject matter, therefore, is not to be restricted except in the spirit of the appended claims.

What is claimed is:

1. A method of printing an electronic component comprising:

providing a surface;

providing a redox couple comprising an oxidizer and a reducer;

solubilizing at least one of the oxidizer and the reducer in a first solution that contains no more than 5% particulates by weight;

applying the first solution to the surface in a desired pattern rather than coating the entire surface with the first solution, to create a first layer, wherein said desired pattern is defined by a printing process that makes no use of a mask;

initiating a redox reaction in the first layer; and completing the component by adding at least one additional layer.

2. The method of claim 1 wherein the component comprises a power source.

3. The method of claim 1 wherein the component comprises a battery.

4. The method of claim 1 wherein at least one of the oxidizer and the reducer comprises a metal containing compound, the metal selected from the group consisting of copper, iron, cobalt, tin, gold, silver, palladium, platinum, nickel, lithium, aluminum, and titanium.

5. The method of claim 1 wherein the redox couple includes a material selected from the group consisting of formate, nitrate, alkoxide nitrate, alkoxide perchlorate, acetate nitrate, and acrylate nitrate.

6. The method of claim 1 wherein said applying comprises depositing the first solution using at least one of a stamp and a jet.

7. The method of claim 1 wherein at least one of the first layer or the at least one additional layers comprises an electrolyte.

8. The method of claim 1 wherein the redox reaction results in the first layer consisting essentially of a metal.

9. The method of claim 1 wherein the redox reaction results in the first layer consisting essentially of a mixed metal oxide.

10. The method of claim 1 wherein said initiating the redox reaction comprising radiating the applied solution with microwave radiation.

11. The method of claim 1 wherein said completing the component comprises:

providing a second redox couple comprising a second oxidizer and a second reducer;

solubilizing at least one of the second oxidizer and the second reducer in a second solution;

depositing the second solution onto the first layer, and initiating a redox reaction in the second solution.

12. The method of claim 1 wherein the component comprises a battery, and said applying comprises depositing the first solution using at least one of a stamp and a jet.

13. The method of claim 1 further comprising:

providing a second redox couple comprising a second oxidizer and a second reducer;

solubilizing at least one of the second oxidizer and the second reducer in a second solution;

depositing successive layers of the second solution, and initiating a redox reaction in the successive layers to produce a solid conductor that electrically couples at least two of the layers of the component that are mutually non-adjacent.

14. A method of printing an electronic circuit comprising:

printing a plurality of components according to the method of claim 1; and applying the first solution to the surface in a desired pattern that connects at least two of the plurality of components, and initiating the redox reaction in the desired pattern to produce a conductive trace between the at least two components.

15. The method of claim 14 wherein the pattern has a lateral resolution below 10 $\mu$m.

16. The method of claim 14 wherein the circuit includes a transistor, a power source, and a capacitor.

17. The method of claim 1 wherein the reducer and the oxidizer are each applied to the surface in the desired pattern.

18. A method of printing an electronic component comprising:

providing a surface;

providing a redox couple comprising an oxidizer and a reducer;

solubilizing at least one of the oxidizer and the reducer in a first solution that contains no more than 5% particulates by weight;

applying the first solution to the surface in a pattern of a trace to create a first layer, wherein said pattern of a trace is defined by a printing process that makes no use of a mask;

applying energy to the entire surface;

initiating a redox reaction in the first layer; and completing the component by adding at least one additional layer.

* * * * *